United States Patent [19]

Leidich

[11] 3,887,880

[45] June 3, 1975

[54] BIAS CIRCUITRY FOR STACKED TRANSISTOR POWER AMPLIFIER STAGES

[75] Inventor: Arthur John Leidich, Flemington, N.J.

[73] Assignee: RCA Corporation, New York, N.Y.

[22] Filed: May 24, 1973

[21] Appl. No.: 363,563

[52] U.S. Cl. .................... 330/22; 330/18; 330/19; 330/38 M

[51] Int. Cl. .................... H03f 3/04

[58] Field of Search ......... 330/15, 18, 19, 28, 38 M, 330/22, 40, 23

[56] References Cited

UNITED STATES PATENTS

| | | | |
|---|---|---|---|
| 3,668,541 | 6/1972 | Pease | 330/23 |
| 3,760,288 | 9/1973 | Leonard | 330/38 M X |

*Primary Examiner*—R. V. Rolinec
*Assistant Examiner*—Lawrence J. Dahl
*Attorney, Agent, or Firm*—H. Christoffersen; S. Cohen; A. L. Limberg

[57] ABSTRACT

Stacked transistor power amplifier stages in an integrated-circuit quasi-linear amplifier are supplied quiescent bias currents which are in inverse proportion to their forward current gains. This permits selection of their quiescent collector currents to be at sufficiently low levels to reduce to low values both cross-over distortion and quiescent dissipation.

9 Claims, 7 Drawing Figures

BIAS CIRCUITRY FOR STACKED TRANSISTOR POWER AMPLIFIER STAGES

The present invention relates to bias circuitry for stacked transistor amplifier stages and particularly to such circuitry for use in Class B audio power amplifiers constructed in integrated form. related The term "stacked amplifier stages" refers to amplifiers in which the output circuits of the amplifier stages are serially connected for quiescent current flow. The output circuits of the amplifier stages are normally operated in push-pull for signal. The term "quasi-linear amplifier" refers to an amplifier in which the output signal is linearly relates to the input signal, but in which the individual stages are operated non-linearly. The individual stages in a quasi-linear amplifier typically are operated Class B or Class AB. Beta, $\beta$ and $h_{fe}$ are various terms for the forward current gain of a transistor connected in common-emitter amplifier configurations. "Cross-over distortion" is the distortion in the output signal of a quasi-linear amplifier arising from the input signal causing the conduction of one of its devices to be reduced to zero before causing the other of its devices to become conductive.

As known (for instance, from the article "HIGH IMPEDANCE DRIVE FOR THE ELIMINATION OF CROSSOVER DISTORTION," Faran and Fulks, *THE SOLID STATE JOURNAL*, Aug. 1961, pp. 36–40) there are desirable features associated with driving quasi-linear amplifiers by applying bias and signal currents from high-impedance sources (current-mode biasing) rather than bias and signal voltages from low-impedance sources (voltage-mode biasing). A transistor exhibits less pronounced non-linearity in its beta as its conduction is reduced than it does in its transconduction ($g_m$). Therefore, current mode biasing has an inherent advantage in linearity over voltage-mode biasing.

It is simple to add signal currents to the quiescent base bias currents of power amplifier output transistors when using current-mode biasing without interfering with the stabilizing of the operating points of the transistors to forestall thermal runaway. It is a more difficult task to add signal voltages to the temperature stabilized bias potentials applied at low impedance level to the base-emitter junctions of the power amplifier transistors when voltage-mode biasing is used, and at the same time, to avoid incurring an unacceptably high risk of thermal runaway. Rapid heating of the output transistors during signal excursions can reduce their base-emitter offset potentials so fast that the regulation of the temperature-compensating network cannot follow to provide the required reduction of applied bias potential to avoid thermal runaway.

When current-mode biasing is employed in an integrated-circuit amplifier, in which the quiescent base currents applied to the transistors are fixed, the quiescent collector currents of the output transistors vary as a function of their betas. So, accordingly, does the quiescent power dissipation of these transistors. Betas of integrated circuit transistors can vary over a wide range from one production run to another due to process variations. Also, beta exhibits percentage changes with temperature which can be greater than those exhibited by the offset potential $V_{BE}$ of forward-biased semiconductor junctions which may be used to regulate the base-emitter potentials of the amplifier output transistors.

In a stacked-transistor power amplifier constructed in accordance with the present invention, the output transistors have quiescent base currents applied to them which vary inversely proportionally to their beta, whereby their quiescent collector currents are defined in a substantially beta-independent manner. This permits the output transistors to be biased at a level just sufficient to avoid crossover distortion despite beta variations caused by temperature change and processing variations in device manufacture. The quiescent base current applied to each of the output transistors is proportional to the base current flowing in an auxiliary transistor which has its collector-to-emitter current flow regulated to a predetermined direct current level. The output transistors are thermally coupled to the auxiliary transistor by being located together within an integrated circuit or by being mounted close by each other on a common heat sink.

The present invention will be better understood from the following detailed description and from the drawing in which.

Figure 1:
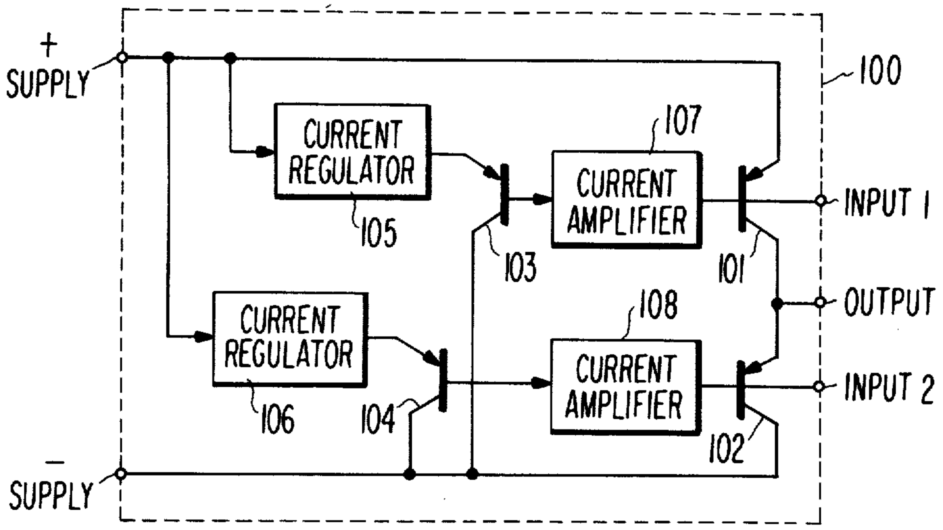
FIG. 1 is a schematic diagram, partially in block form, of an embodiment of the present invention.
Figure 2:
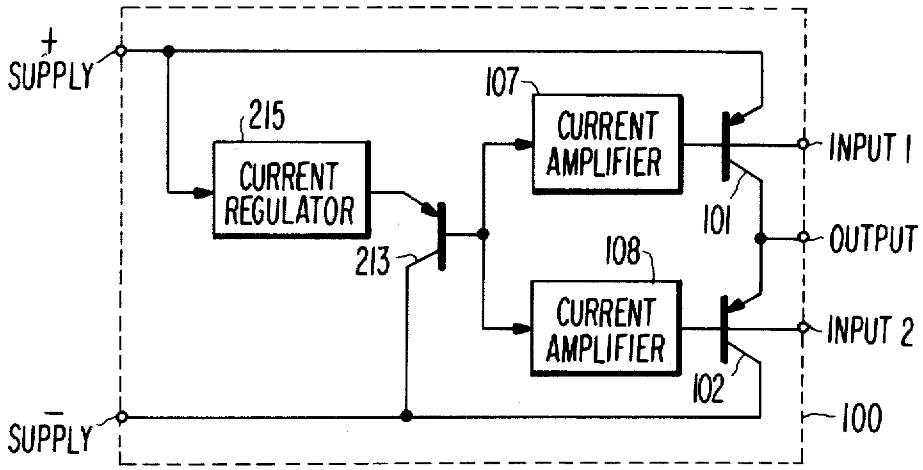
FIG. 2 is a schematic diagram, partially in block form, of a preferred embodiment of the present invention.
Figure 3A:
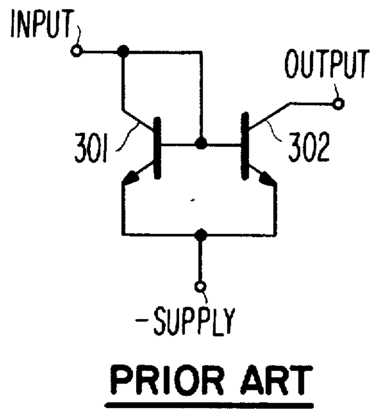
PRIOR ART FIG. 3a
Figure 3B:
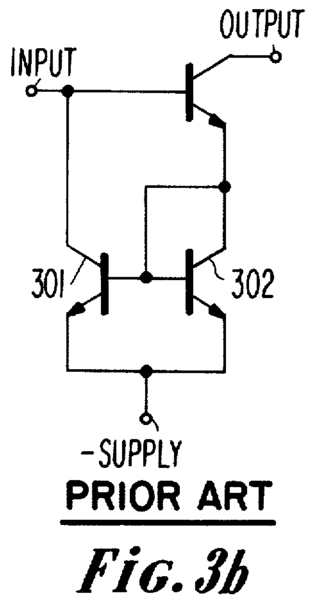
PRIOR ART FIG. 3b
Figure 3C:
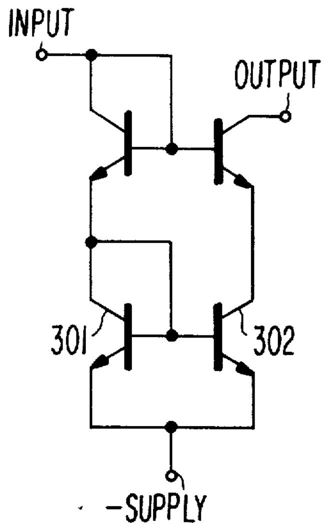
Figure 4:
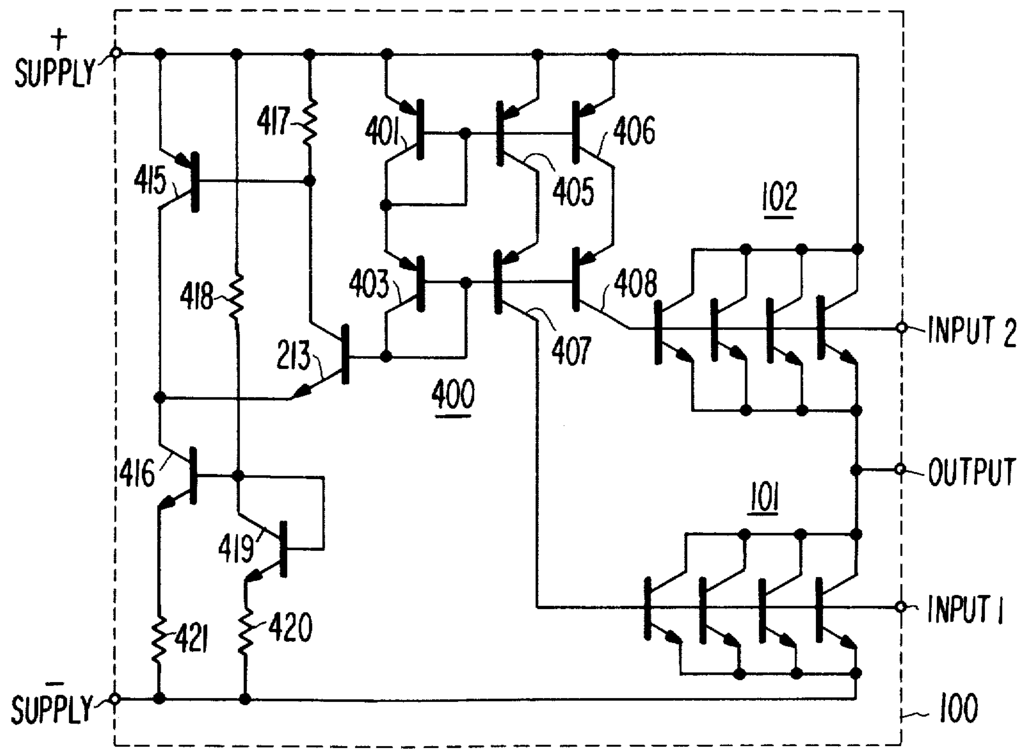
Figure 5:
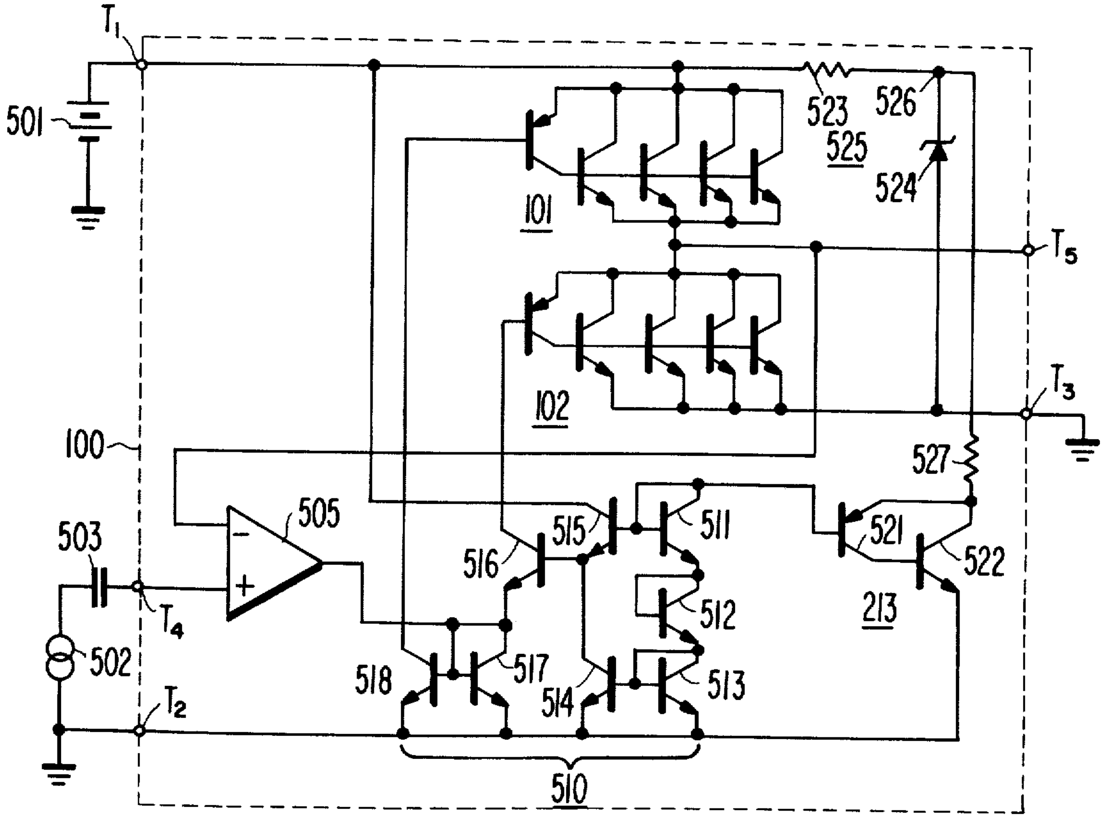

FIGS. 3*a*, 3*b* and 3*c* are schematic diagrams of current amplifiers known in the prior art and of particular use in constructing the embodiments of the present invention shown in FIGS. 1 and 2;

FIG. 4 is a schematic diagram of an embodiment of the present invention; and FIG. 5 is a schematic diagram of a preferred embodiment of the present invention.

In FIG. 1, an integrated circuit 100 includes therein transistors 101, 102, 103, 104. Transistors 101, 102, 103, 104 have substantially equal betas ($h_{fe}$'s). However, transistors 101, 102 may possess larger structures than transistors 103, 104 in order to increase their current-handling capabilities. Transistors 101, 102, are serially connected, or "stacked," for application of energizing potential via terminals +SUPPLY and −SUPPLY. Transistors 101, 102 are adapted to function as the output amplifier stages of a quasi-linear amplifier formed therewith by applying push-pull signals to their base electrodes from a pre-amplifier (not shown). These push-pull signals may be supplied to terminals INPUT 1 and INPUT 2, respectively, by a pre-amplifier (not shown) external to integrated circuit 100, or, alternatively, internal thereto. Transistors 101, 102 supply a load (not shown) as may be coupled between a terminal OUTPUT and the supply (not shown) used to supply energizing potential to transistors 101, 102. The connections of transistors 101, 102 are push-pull parallel for supplying output signal from the terminal OUTPUT.

The emitter-current flows in transistors 103 and 104 are regulated by current regulators 105 and 106, respectively. These regulators 105, 106 are shown in FIG. 1 as directly regulating the emitter currents of transistors 103, 104. This is an expedient way of substantially regulating the emitter-to-collector current flow of a transistor when its beta ($h_{fe}$) is substantially greater than one, since the emitter-to-collector current flow is $h_{fe}/1+h_{fe}$ times as large as its emitter current. In normal transistors, $h_{fe}$ typically exceeds 30.

To support the regulated emitter currents of transistors 103, 104, they must have suitable respective base current flows, which also may flow in the input circuits of current amplifiers 107, and 108, respectively. The base currents of transistors 103, 104 are $1/h_{fe}$ times their emitter-to-collector flows. The input circuit of each of the current amplifiers 107, 108 provides a direct current path for biasing the base electrode of the associated one of transistors 103, 104. The input circuits of the current amplifiers 107, 108 typically exhibit much lower impedances than do their output circuits, which are coupled to the base electrodes of transistors 101, 102, respectively. The current amplifiers 107, 108 are inverting current amplifiers, which is to say their input and output currents both flow into them or both flow out of them.

The emitter currents of transistors 103, 104 are constrained to be equal by the current regulators 105, 106. The $h_{fe}$'s of transistors 103, 104 are substantially equal; so if their emitter currents are alike, then their base currents are alike. The gains of the current amplifiers 107, 108 being substantially equal and their input currents being alike, the output currents supplied to the base electrodes of transistors 101, 102 are substantially equal. Transistors 101, 102 have substantially equal $h_{fe}$'s. Their emitter-to-collector currents are each $h_{fe}$ times as large as their respective base currents and are therefore substantially equal, providing a quiescent current flow through their emitter-to-collector paths.

This quiescent current flow can be set to be just large enough to overcome the effects of cross-over distortion in the output stage formed by transistors 101, 102 without substantially reducing the range of quasi-linear amplifier operation. This maintains quiescent power dissipation of the transistors 101, 102 at a constant low value. The level of quiescent current flow can be varied by the following means:

1. adjustment of the level to which the emitter-to-collector currents of transistors 103, 104 are regulated, and/or
2. adjustment of the equal current gains of the current amplifiers 107, 108.

The transistors 101, 102 may be constructed with much larger current handling capability than transistors 103, 104; but the $h_{fe}$'s of all of these transistors are substantially alike since they are formed by the same sequence of steps, being within the same integrated circuit 100. Consequently, adjustment of the relative $h_{fe}$'s of transistors 101, 102 with respect to those of transistors 103, 104 normally is not available as a means of setting the level of quiescent current flow in transistors 101, 102.

The fact that the $h_{fe}$'s of transistors 103, 104 are substantially equal to the $h_{fe}$'s of transistors 101, 102 means their $h_{fe}$'s are proportional to each other on any given integrated circuit despite variations of manufacture from one integrated circuit to another. This proportionality permits the quiescent collector-to-emitter current flows of transistors 101, 102 to be set just to preclude cross-over distortion reproducably from integrated circuit to integrated circuit. Higher $h_{fe}$ will reduce the base currents required by transistors 101, 102 to maintain the desired level of quiescent current flow through them. Higher $h_{fe}$ reduces in inverse proportion the base currents flowing in transistors 103, 104 responsive to their substantially fixed emitter-to-collector currents. These reduced base currents from transistors 103, 104 respectively applied to current amplifiers 107, 108 result in reduced base currents being supplied to the base electrodes of transistors 101, 102, respectively. The base currents supplied to transistors 101, 102 are reduced in response to the increased $h_{fe}$'s of transistors 103, 104 in the correct proportion to meet the reduced base current requirements in response to the increased $h_{fe}$'s of transistors 101, 102. The variations of the $h_{fe}$'s of transistors 101, 102, 103, 104, caused by temperature variation are compensatory, just as those resulting from manufacturing variation are. Increased quiescent dissipation because of increase in the $h_{fe}$'s of transistors 101, 102 with temperature change is therefore forestalled.

Conversely, lower $h_{fe}$ will increase the base currents required by transistors 101, 102 to maintain the desired level of quiescent current flow through them. Lower $h_{fe}$ increases the base currents flowing in transistors 103, 104, responsive to their substantially fixed emitter-to-collector currents. These increased base currents from transistors 103, 104, respectively applied to current amplifiers 107, 108 result in increased base currents supplied to the base electrodes of transistors 101, 102, respectively satisfying their increased requirements.

FIG. 2 shows an embodiment of the present invention which tends to be more economical of circuitry than the embodiment shown in FIG. 1. A single transistor 213 with a single current regulator 215 replaces transistors 103, 104 and current regulators 105, 106. The emitter-to-collector current of transistor 213 is maintained substantially constant by the current regulator 215. The base current of transistor 213 is $1/h_{fe}$ times its emitter-to-collector current, which current is divided equally between the input circuits of current amplifiers 107, 108, which have equal input impedances. If the emitter-to-collector current flow of transistor 213 is caused by current regulator 215 to be twice as large as those of transistors 103, 104 were caused individually to be by current regulators 105, 106; the base current of transistor 213 will be twice as large as that of either of transistors 103, 104. Dividing this doubled base current evenly between the input circuits of current amplifiers 107, 108 causes the same conditions in them as were caused by elements 103, 104, 105, 106. Elements 213, 215 can therefore serve as a direct replacement for elements 103, 104, 105, 106.

FIGS. 3*a*, 3*b*, 3*c* shows representative prior art current amplifier configurations each having a current gain determined solely by the relative geometries of its component devices, and being suitable for use as current amplifier 107 or 108 in the amplifiers shown in FIGS. 1 and 2. In each of these current amplifiers, the base-emitter potential of a transistor 301 having its collector electrode connected to the INPUT terminal is regulated by collector-to-base negative feedback so as substantially to equal the current applied to the INPUT terminal. The potential applied by this feedback to the base-emitter junction of transistor 301, is also applied to the base-emitter junction of transistor 302 and regulates its collector current withdrawn via the OUTPUT terminal from the ensuing circuitry (the base electrode of transistor 101 and 102 in the circuitry of FIGS. 1 and 2). Since current density across the base-emitter junction of a transistor is regulated by applied base-emitter potential, the current gain of these current amplifiers is determined by the ratio of the effective base-emitter junction area of transistor 302 to that of transistor 301—solely a geometric consideration which can be reproduced reliably from integrated circuit to integrated circuit. The current amplifier shown in FIG. 3*c* is described in detail in U.S. Pat. application Ser. No. 318,645, filed Dec. 26, 1972 in the name of Harold Allen Wittlinger; entitled "CURRENT AMPLIFIER" and assigned to RCA Corporation.

FIG. 4 illustrates an embodiment of the present invention in which the emitter-to-collector current (or collector current) of transistor 213 is regulated by regulator means 410, rather than its emitter current being regulated. Output transistors 101, 102 as shown in FIG. 4 are both composite transistors, each comprising four parallelled component transistors. This increases the current handling capabilities of transistors 101, 102 but does not substantially affect their $h_{fe}$'s. Transistors 101, 102 are shown as NPN rather than PNP types, and the supply potentials applied to them have been appropriately reversed.

The quiescent base currents to the composite transistors 101, 102 are supplied from a combined pair 400 of current amplifiers (providing the functions of current amplifiers 107, 108, respectively, of FIGS. 1 and 2) which are the type shown in FIG. 3*c* and described in the above-cited patent application Ser. No. 318,645, but share the use of elements 401, 403. A current proportional to the base currents required by transistors 101, 102 to avoid cross-over distortion is supplied from the base electrode of transistor 213 to the series combination of diode-connected transistors 401, 403. The diode-connected transistors 401, 403 each respond to develop the base-emitter offset potential to support this current flow, which flows principally as collector current flow through transistors 401, 403. The base-emitter potential of transistor 401 applied to the base-emitter junctions of transistors 405, 406 causes them to have collector current flows related to the collector current of transistor 401 by a certain gain factor K. Presuming the transistors 405 and 406 to be identical in structure, this gain factor K is equal to the effective base-emitter junction area of one of these transistors to that of transistor 401.

The collector currents of transistors 405, 406 are coupled with substantially unity current gain to the base electrodes of transistors 101, 102 respectively by the common-base amplifier transistors 407, 408, respectively. The base current to be supplied from the base electrode of transistor 213 is then 1/K times as large as that supplied to each of the base electrodes of transistors 101, 102. The collector current of transistor 213 should be regulated to 1/K times as large as the quiescent collector currents to be maintained in transistors 101, 102 to avoid cross-over distortion.

In FIG. 4, the serial combination of resistor 417 and the collector-to-emitter path of transistor 213 is parallelled by the emitter-to-collector path of a shunt regulator transistor 415. The collector electrode of transistor 416 is arranged to withdraw a direct current from this parallel combination which is greater than the desired collector current of transistor 213. Were the collector current for transistor 213 to decrease below its desired value, the potential drop across resistor 417 which forward biases the base-emitter junction of transistor 415 would be reduced. The conduction of the emitter-to-collector path of transistor 415 would consequently be reduced, so more current would be withdrawn from the emitter electrode or transistor 213. This would increase the collector current of transistor 213, tending to correct its decrease below its desired value.

Any excessive collector current from transistor 213 increases the potential drop across resistor 417 to bias transistor 415 into more pronounced forward conduction. A greater portion of the collector current of transistor 416 is caused to flow via the emitter-to-collector path of transistor 415, reducing the current withdrawn from emitter electrode of transistor 213. This decreases the collector current of transistor 213, tending to correct its increase above its desired value.

The biasing of transistor 416 is straightforward. Its base electrode is supplied with forward-biasing potential by a potential divider comprising resistor 418, diode-connected transistor 419, and resistor 420. The offset potential developed across diode-connected transistor 419 compensates the offset potential across the base-emitter junction of transistor 416. The potential appearing across resistor 421 is substantially the same as that appearing across resistor 420. The resistance of resistor 421 is chosen according to Ohm's Law to be small enough with respect to the potential applied to it to cause emitter current flow in transistor 416 sufficiently large to support its collector current requirement.

This requirement, as previously noted, is that the collector current of transistor 416 exceeds the collector-to-emitter current desired through transistor 213. Transistor 415 can then always be maintained partially conductive, whereby its shunt regulating action is maintained.

FIG. 5 shows an amplifier in which the current amplifiers used for biasing the input circuits of the output stages are provided by the means used to develop Class B signals for application to the input circuits of the output stages.

The integrated circuit 100 has a source of energizing potential 501 applied between its terminal $T_1$ and its ground terminals $T_2$, $T_3$. Input signals from a source 502 are coupled via a capacitor 503 to an input terminal $T_4$ of the integrated circuit 100, where $T_4$ is connected to the non-inverting input circuit of a preamplifying differential amplifier 505 therein. The differential amplifier 505 compares this input signal with a feedback signal coupled from the output stages 101, 102 to its inverting input circuit and provides an error signal current from its output circuit to a phase-splitting amplifier 510.

Phase-splitting amplifier 510 is of a sort described in U.S. Pat. No. 3,573,645 issued Apr. 6, 1971, to Carl Franklin Wheatley, Jr.; entitled "PHASE-SPLITTING AMPLIFIER" and assigned to RCA Corporation. The phase-splitting amplifier 510 accepts input signal currents and responds to provide output signal currents in Class B push-pull relationship with each other to the composite devices 101, 102, respectively. The composite devices 101, 102 each function as a PNP transistor connected in common-emitter amplifier configuration and operate together in push-pull to supply an output signal at terminal $T_5$.

Negative portions of the signal output currents from pre-amplifier 505 cause transistor 516 to function as a common-base amplifier with unity current gain, coupling these negative currents without inversion to composite device 102. At the same time, common-emitter amplifier transistor 518 is biased out of conduction by the negative current from pre-amplifier 505. Positive portions of the signal currents from pre-amplifier 505 bias transistor 516 out of conduction. Because of the diode-connected transistor 517 parallelling its base-emitter junction, common-emitter amplifier transistor 518 amplifies these positive currents with minus unity current gain and supplies the resultant negative currents to the composite device 101.

The transistor 213 is a composite PNP transistor. Transistor 213 comprises a PNP input transistor 521 conventionally constructed in a lateral structure and NPN output transistor 522 conventionally constructed in a vertical structure. Transistors 521 and 522 are in cascade connection, the collector electrode of transistor 521 being direct coupled to the base electrode of transistor 522, in consequence whereof the forward current gain of the composite transistor 213 equals $h_{fePNP}$ times $h_{feNPN}$, the product of their respective individual common-emitter forward current gains. The "base" electrode of the composite PNP transistor 213 is at the base electrode of transistor 521. The "emitter" electrode of the composite PNP transistor 213 is at the interconnection of the emitter electrode of transistor 521 and the collector electrode of transistor 522. The "collector" electrode of composite PNP transistor 213 is at the emitter electrode of transistor 522.

The output transistors 101, 102 are also composite PNP transistors and derive their base current biasing from the base current of composite PNP transistor 213. The devices 101, 102 generally are provided substantially greater current handling capabilities than transistor 213, since they must provide substantial current to any load coupled to terminal $T_5$. This may be done by increasing the base-emitter junction area of their component NPN devices. One way to do this is to parallel several NPN devices as shown in FIG. 5. The current provided by the collector of the PNP input transistor of device 101 or 102 is distributed in substantially equal portions among the base electrodes of the NPN transistors. These portions are individually amplified by the NPN transistors, after which the amplified portions are summed. The forward current gains of the devices 101, 102 are substantially the same as that of device 213.

The emitter current of the composite transistor 213 is regulated in the following way. Resistor 523 and avalanche diode 524 form a shunt regulator circuit 525 providing a substantially fixed potential $V_{525}$ at node 526, as referred to ground potential. If avalanche diode 524 is provided by the reverse-biased base-emitter junction of a transistor, this potential would typically be in the order of 7 volts. The base current of transistor 521 forward-biases diode-connected transistors 511, 512, 513, developing a regulated potential thereacross equal to three base-emitter offset potentials ($V_{BE}$'s). The emitter electrode potential of transistor 521 is one $V_{BE}$ more positive than its base potential and is regulated by the rectifier characteristics of the base-emitter junction of transistors 511, 512, 513. The potentials at the ends of resistor 527 being fixed at $V_{525}$ and $4V_{BE}$, respectively, a $V_{525}$–$4V_{BE}$ potential must appear across resistor 527. The resistance $R_{527}$ of resistor 527 may be chosen according to Ohm's Law to cause a desired value of "emitter" current $I_{E213}$ in composite transistor 213. That is:

$$I_{E213} = \frac{(V_{525} - 4V_{BE})}{R_{527}} \qquad (1)$$

Since the forward current gain of composite transistor 213 is generally in the order of several hundred, its collector current is substantially equal to its emitter current. Therefore:

$$I_{C213} = \frac{(V_{525} - 4V_{BE})}{R_{527}} \qquad (2)$$

The base current $I_{B213}$ of transistor 213 is smaller than $I_{C213}$ by its current gain. That is:

$$I_{B213} = \frac{(V_{525} - 4V_{BE})}{h_{fePNP}\, h_{feNPN}\, R_{527}} \qquad (3)$$

The base current $I_{B213}$ of transistor 521 is provided primarily by diode-connected transistors 511, 512, 513.

The $V_{BE}$'s of transistors 511, 512, 513 are adjusted by virtue of their direct collector-to-base negative feedback connection to be of value such that their collector and base currents provide the $I_{B213}$ demanded. These transistors 511, 512, 513 are assumed to have similar geometries to each other and to transistors 514, 515. The base-emitter potential developed by transistor 513 is applied by the base-emitter junction of transistor 514, which responds to drawing a collector current equal to that of transistor 513—that is, to $I_{B213}$. This collector current is withdrawn by transistor 514 from the emitter electrode of transistor 515, causing a base-emitter potential drop in transistor 515 substantially equal to that of each of transistors 511, 512, 513, 514. Accordingly, the emitter electrode of transistor 515 is at a potential substantially equal to twice the $V_{BE}$ which is characteristic of a collector current $I_{B213}$. Because of the emitter follower action of transistor 515, substantial base current can be drawn by common-base amplifier transistor 516 without the impedance presented to its base electrode undesirably being decreased.

The $2V_{BE}$ potential at the emitter electrode of transistor 515 is divided substantially equally between the base-emitter junctions of transistors 516 and 517. The reason for this is as follows. The quiescent emitter current of transistor 516 equals the combined quiescent base and quiescent collector currents of transistor 517 plus the quiescent base current of transistor 518. If the $h_{fe}$'s of transistors 517 and 518 are appreciably large (say 30 or more, as generally is the case) the base currents of transistors 517, 518 are negligible compared to the collector current of transistor 517. The quiescent emitter current of transistor 516 may then be considered substantially equal to the combined quiescent collector and quiescent base currents of transistor 517, which, in turn, equals the quiescent emitter current of transistor 517. Since the quiescent emitter currents of transistors 516 and 517 are substantially equal, the base-emitter voltages are subsequently substantially equal. If this is so, half the $2V_{BE}$ potential at the emitter electrode of transistor 515 must appear across each of the base-emitter junctions of transistors 516, 517 under quiescent conditions.

The current densities in the base-emitter junctions of transistors formed by similar processing are equal if their base-emitter voltages are equal. Accordingly, the quiescent currents flowing in transistors 516, 517, 518 are equal to their counterpart currents in transistors 511–515 if all of these transistors have the same effect base-emitter junction areas. More generally, the quiescent emitter currents $I_{E516}$ and $I_{E518}$ respectively may be related to each other and to $I_{B213}$ as follows, where m is ratio of the base-emitter junction areas of transistors 511–515 to those of transistors 516–518:

$$I_{E516} \doteq I_{E517} \doteq I_{E518} \doteq mI_{B213}. \quad (4)$$

where the symbol $\doteq$ means substantially equal.

The quiescent collector currents $I_{C516}$, $I_{C517}$ and $I_{C518}$ of transistors 516, 517 and 518, respectively, are proportioned to their respective quiescent emitter currents $I_{E516}$, $I_{E517}$ and $I_{E518}$ by the factor $h_{feNPN}/(h_{feNPN}+1)$ where $h_{feNPN}$ is the common emitter forward current gain of each of these similar NPN transistors. For substantially large $h_{fe}$ (say 30 or more, as generally is the case):

$$I_{C516} \doteq I_{C518} \doteq mI_{B213} \quad (5)$$

Considering equations 3 and 5, the base electrodes of the composite devices 101, 102 are provided with quiescent base currents $I_{B101}$, $I_{B102}$, respectively, of values expressed as follows:

$$I_{B101} \doteq I_{B102} \doteq \frac{m(V_{525} - 4V_{BE})}{h_{fePNP}\, h_{feNPN}\, R_{527}} \quad (6)$$

The forward current gain of each of the composite devices 101, 102 is $h_{fePNP}\, h_{feNPN}$. Their respective quiescent collector currents, $I_{C101}$ and $I_{C102}$, can then be expressed as follows:

$$I_{C101} = I_{C102} = \frac{m(V_{525} - 4V_{BE})}{R_{527}} \quad (7)$$

Thus the quiescent collector currents of composite devices 101, 102 are substantially constant, and their value can be adjusted by choice of $m$; $R_{527}$ and $V_{525}$ to reduce cross-over distortion to the level which will be tolerated.

At the same time, no extra quiescent current flow need be provided to accomodate change of $I_{C101}$, $I_{C102}$ with change in temperature or to accomodate manufacturing tolerances in $h_{fePNP}$ and $h_{feNPN}$. The forward current gain of each of the devices 101, 102, 213 is $h_{fePNP}\, h_{feNPN}$. If this gain is high, $I_{B213}$ will be decreased. The $I_{B101}$, $I_{B102}$ currents equal to $I_{B213}$ will be decreased. But the $h_{fePNP}\, h_{feNPN}$ forward current gain of composite devices 101, 102 will be increased and compensate for the decrease in $mI_{B213}$, and the collector currents $I_{C101}$, $I_{C102}$ of the composite devices 101 and 102 will be unaffected by the increased $h_{fePNP}\, h_{feNPN}$. Similarly, low $h_{fePNP}\, h_{feNPN}$ will cause larger $I_{B213}$ currents to be applied to the base electrodes of composite devices 101, 102; but the reduced forward current gain $h_{fePNP}\, h_{feNPN}$ in these devices will cause their collector currents $I_{C101}$ and $I_{C102}$ to be unaffected in value by $h_{fePNP}\, h_{feNPN}$ variation.

While the collector electrodes of transistors 516, 518 are shown as being connected to the base electrodes of composite devices 101, 102 respectively in FIG. 5, these connections may be interchanged. The connections shown are preferable in that the gain of the common-emitter amplifier transistor 518 is unaffected by collector potential variations that would otherwise be coupled thereto from terminal $T_5$, eliminating a source of minor gain distortion.

In the claims, the word transistor includes composite devices using a number of individual component transistors and exhibiting the same type of current gain functions as a single transistor does.

While the present invention has been described in the context of monolithic integrated circuitry where it is particularly advantageous, the present invention may be employed in hybrid integrated circuitry. The current amplifiers 107, 108 and the current regulators 105, 106 in a configuration similar to that shown in FIG. 1 need not be realized on the same integrated circuit as transistors 101, 102, 103, 104. The current amplifiers 107, 108 and the current regulator 215 in a configuration similar to that shown in FIG. 1 need not be realized on the same integrated circuit as transistors 101, 102, 103, 104. The current amplifiers 107, 108 and the current regulator 215 in a configuration similar to that shown in FIG. 2 need not be on the same integrated circuit as transistors 101, 102, 103, 104. The transistors 101, 102, 103, 104 of a configuration similar to that shown in FIG. 1 may be selectively matched discrete devices mounted on a common heat sink close by each other. The transistors 101, 102, 213 of a configuration similar to that shown in FIG. 2 may be selectively matched discrete devices mounted on a common heat sink close by each other.

What is claimed is:

1. An amplifier comprising, in combination:

first and second transistors of the same conductivity type, each having emitter, base and collector electrodes, each having the same common-emitter forward current gain denominated beta;

first and second terminals for the application of an energizing potential therebetween and a third terminal, said first transistor emitter electrode being connected to said first terminal, said first transistor collector electrode and said second transistor emitter electrode each being connected to said third terminal, said second transistor collector electrode being connected to said second terminal;

auxiliary transistor means, including emitter electrode means and collector electrode means and base electrode means, and being thermally coupled to said first and second transistors;

means connected between the emitter electrode means and collector electrode means of said auxiliary transistor means for causing a constant current flow therebetween within said auxiliary transistor means; and first and second current amplifier means, each having a constant and temperature-independent current gain of substantially equal value to the current gain of the other, each having an input circuit connected to the base electrode means of said auxiliary transistor means to receive an input current therefrom, and each having an output circuit for responding to its input current to provide an oppositely directed output current, the output currents being respectively applied to separate ones of the base electrodes of said first and said second transistors.

2. A quasi-linear amplifier comprising:

first and second and third and fourth transistors, of the same conductivity type, each having base and emitter and collector electrodes, and all having substantially the same common-emitter forward current gain or beta, said third and said fourth transistors being thermally coupled respectively to said first transistor and to said second transistor;

first and second terminals for the application of an energizing potential therebetween and a third terminal, said first transistor emitter electrode being connected to said first terminal, said first transistor collector electrode and said second transistor emitter electrode each being connected to said third terminal, said second transistor collector electrode being connected to said second terminal;

means connected between the collector and emitter electrodes of said third transistor for causing a substantially constant collector-to-emitter current flow of a fixed value through said third transistor thereby to establish a base current flow for said third transistor inversely proportional to its beta;

means connected between the collector and emitter electrodes of said fourth transistor for causing a substantially constant collector-to-emitter current flow also of said fixed value through said fourth transistor thereby to establish a base current flow for said fourth transistor inversely proportional to its beta; and first and second current amplifier means, each having a constant and temperature-independent current gain of substantially equal value to the current gain of the other, having respective input circuits connected respectively to said third transistor base electrode and having respective output circuits, the output circuit of said first amplifier means being connected to said first transistor base electrode and responding to the flow of said third transistor base current into its input circuit to supply an oppositely directed output current to said first transistor base electrode, and the output circuit of said second current amplifier means being connected to said second transistor base electrode and responding to the flow of said fourth transistor base current into its input circuit to supply an oppositely directed output current to said second transistor base electrode.

3. A quasi-linear amplifier as set forth in claim 2 wherein each of said first and said second current amplifier means comprises:

input and output and common terminals, said input and said common terminals for connection to the input circuit of the current amplifier and said output and said common terminals for connection to the output circuit of the current amplifier;

input and output transistors having collector electrodes respectively connected to said input and said output terminals, each having an emitter electrode connected to said common terminal, and each having a base electrode; and negative feedback means coupling said input terminal to the base electrodes of said input and said output transistors.

4. A quasi-linear amplifier comprising:

first and second and third transistors of the same conductivity type each having base and emitter and collector electrodes and all having substantially the same common emitter forward current gain or beta, said third transistor being thermally coupled to said first and said second transistors;

first and second terminals for the application of an energizing potential therebetween and a third terminal, said first transistor emitter electrode being connected to said first terminal, said first transistor collector electrode and said second transistor emitter electrode each being connected to said third terminal, said second transistor collector electrode being connected to said second terminal;

means connected between the collector and emitter electrodes of said third transistor, for causing a substantially constant collector-to-emitter current flow through said third transistor, thereby to establish a base current flow for said third transistor inversely proportional to its beta; and first and second current amplifier means, each having a constant and temperature-independent current gain of substantially equal value to the current gain of the other, each having an input circuit and each having an output circuit, said input circuits of said first and said second current amplifier means each connected to receive as an input current a similar portion of the base current flow of said third transistor, the output circuit of said first current amplifier means being connected to said first transistor base electrode and responding to the flow of input current in its input circuit to supply an oppositely directed output current to said first transistor base electrode, and the output circuit of said second current amplifier means being connected to said second transistor base electrode and responding to the flow of input current in its input circuit to supply an oppositely directed output current to said second transistor base electrode.

5. A quasi-linear amplifier as set forth in claim 4 wherein each of said first and said second current amplifier means comprises:

an input, an output and a common terminals, said input and said common terminals for connection to the input circuit of the current amplifier and said output and said common terminals for connection to the output circuit of the current amplifier;

an input and an output transistors having collector electrodes respectively connected to said input and said output terminals, each having an emitter electrode connected to said common terminal, and each having a base electrode; and negative feedback means coupling said input terminal to the base electrodes of said input and said output transistors.

6. A quasi-linear amplifier comprising, in combination:

first and second terminals for receiving an energizing potential therebetween;

first and second transistors and a third transistor thermally coupled therewith, each having a base and an emitter and a collector electrode, and all having substantially the same common-emitter forward current gain or beta, the collector electrode of said first transistor being connected to said first terminal, the emitter electrode of said second transistor being connected to said second terminal;

an output signal terminal to which the emitter electrode of said first transistor and the collector electrode of said second transistor are connected;

fourth and fifth and sixth similar transistors, each having a base and an emitter electrode with a base-emitter junction therebetween and each having a collector electrode, said fourth transistor emitter electrode being connected to said first terminal;

means connecting said fifth transistor as a first diode between said fourth transistor base electrode and said first terminal;

an input signal terminal to which is connected said fourth transistor base electrode and said sixth transistor emitter electrode;

means connecting the collector electrodes of said fourth and said sixth transistors, respectively, to separate ones of said base electrodes of said first and said second transistors;

means connected between the collector and emitter electrodes of said third transistor for regulating the current through its collector-to-emitter path to substantially constant value thereby to cause said third transistor to have base current flow to be inversely related to its beta;

seventh and eighth transistors each having a collector electrode and an emitter electrode and a base electrode and each having its base electrode connected to its collector electrode to form a diode means between its collector electrode and its emitter electrode, both said diode means being included in a serial connection connected between said third transistor base electrode and said first terminal and poled for forward conduction of the base current flow of said third transistor, whereby a bias potential is developed across said series connection responsive to the base current flow of said third transistor; and means for direct coupling said bias potential to be applied between said fourth transistor base electrode and said first terminal.

7. A quasi-linear amplifier as set forth in claim 6 wherein said means for direct coupling said bias potential includes:

a ninth transistor being arranged for common-collector amplifier operation, having a base electrode connected to said third transistor base electrode and having an emitter electrode connected to said fourth transistor base electrode; and a tenth transistor having a collector electrode and an emitter electrode and a base electrode and having its base electrode connected to its collector electrode to form a diode means between its collector and its emitter electrode which diode means is included in said serial connection of the diode means provided by said seventh and eigth transistors.

8. A quasi-linear amplifier comprising:

first and second terminals for receiving an energizing potential therebetween;

an input signal terminal;

an output signal terminal;

first and second and third composite transistors, each having a base and an emitter and a collector electrodes, each including a transistor of a first conductivity type having collector and emitter electrodes respectively connected to its emitter and collector electrodes, each further including a transistor of a second conductivity type having base and emitter electrodes respectively connected to its base and emitter electrodes and having a collector electrode connected to the base electrode of its transistor of first conductivity type, the emitter electrode of said first composite transistor being connected to said first terminal, the collector electrode of said first composite transistor and the emitter electrode of said second composite transistor each being connected to said output signal terminal, the collector electrodes of said first and said third composite transistors each being connected to said second terminal;

means thermally coupling said third composite transistor to each of said first and said second composite transistors so its temperature is the average between their temperatures;

means for providing a regulated potential responsive to energizing potential received between said first and said second terminals;

a resistive element connecting the emitter electrode of said third composite transistor to said means for providing a regulated potential; and a phase-splitting amplifier with first through eighth transistors each having a base and an emitter and a collector electrode, the base and collector electrodes of said first transistor and said fifth transistor base electrode being connected to the base electrode of said third composite transistor, said first transistor emitter electrode being connected to the base and collector electrodes of said second transistor, said second transistor emitter electrode being connected to the base and collector electrodes of said third transistor and to said fourth transistor base electrode, the emitter electrodes of said third and fourth and seventh and eighth transistors being connected to said second terminal, said fifth transistor emitter electrode being connected to said fourth transistor collector electrode and to said sixth transistor base electrode, said fifth transistor collector electrode being connected to said first terminal, the base electrodes of said seventh and said eighth transistors and said seventh transistor collector electrode and said sixth transistor emitter electrode being connected to said input signal terminal, and the collector electrodes of said sixth and said eighth transistors being respectively connected to separate ones of the base electrodes of said first and said second composite transistors.

9. A quasi-linear amplifier as set forth in claim 8 having an integral number N of additional transistors of said first conductivity type parallelly connected with said transistor of said first conductivity type in each of said first and said second composite transistors.

* * * * *